United States Patent [19]

Sanada et al.

[11] Patent Number: 5,014,280

[45] Date of Patent: May 7, 1991

[54] OPTICAL BISTABLE LASER DIODE AND A METHOD FOR CONTROLLING THE SAME

[75] Inventors: Tatsuyuki Sanada, Yokohama; Tetsufumi Odagawa, Ebina, both of Japan

[73] Assignee: Fujitsu Limited, Kawasaki, Japan

[21] Appl. No.: 413,745

[22] Filed: Sep. 28, 1989

[30] Foreign Application Priority Data

Sep. 30, 1988 [JP] Japan .................. 63-248323

[51] Int. Cl.⁵ .................................................. H01S 3/19
[52] U.S. Cl. ............................... 372/45; 372/46; 372/50
[58] Field of Search ............................... 372/43–46, 372/50

[56] References Cited

FOREIGN PATENT DOCUMENTS 0081590 2/1983 Japan ............................ 372/43
0119994 6/1987 Japan ............................ 372/43

*Primary Examiner*—Georgia Epps
*Attorney, Agent, or Firm*—Staas & Halsey

[57] ABSTRACT

An optical bistable laser diode includes an elongated intrinsic active semiconductor element having upper and lower surfaces and a pair of spaced ends. A semiconductor clad layer is disposed on one of the surfaces of the semiconductor element and another semiconductor clad layer of a different conduction type is disposed on the other surface of the semiconductor element. One of the semiconductor layers is coextensive in length with the semiconductor element. The diode includes a mirror at each end of the semiconductor element presenting a resonator. The diode also includes first and second electrodes on the coextensive semiconductor layer. One electrode extends along the semiconductor layer from one end thereof for a distance $L_1$. The other electrode extends along the semiconductor layer from the other end thereof for a distance $L_2$. The electrodes are disposed in longitudinal alignment and the same are spaced apart a distance $L_3$ presenting a gap therebetween defining a saturable absorption region in the active semiconductor layer. The distances $L_1$, $L_2$ and $L_3$ are such that the same satisfy the relationship $$(L_2 + L_3/2)/(L_1 + L_2 + L_3) \leq 0.3.$$

18 Claims, 10 Drawing Sheets

Reset voltage pulse
Carrier
Set optical pulse
Output

Reset current pulse
Carrier
Set optical pulse
Output

OPTICAL BISTABLE LASER DIODE AND A METHOD FOR CONTROLLING THE SAME

BACKGROUND OF THE INVENTION

The present invention generally relates to optical bistable laser diodes and more particularly to the structure of such a laser diode and a control method for operating such diode at a high speed.

Recently, optical bistable laser diodes have received attention as essential elements for constructing optical logic devices or optical memory devices for use in optical information processing systems or optical computers. Such devices having optical bistability are suited for optical information processing based on binary logic as the state of the device is switched between an optical high level state and an optical low level state similarly to the flip-flops used in conventional electronic processing systems.

FIG. 1 shows a typical prior art bistable laser diode. Referring to the drawing, the device comprises a clad layer 11 of a semiconductor material doped to a first conduction type, an active layer 12 of undoped semiconductor material provided on the clad layer 11, and another clad layer 13 doped to another conduction type further provided on the active layer 12. On the clad layer 13, there are provided first and second electrodes 14a and 14b forming a tandem electrode structure respectively in correspondence to a gain region 15 and a control region 17, both defined in the active layer 12. The gain region 15 is supplied with a drive current $I_1$ through the first electrode 14a and produces optical radiation by photon emission. The control region 17 is also supplied with a control current $I_2$ through the second electrode 14b and controls the overall gain of the laser diode. In the prior art device, the level of the control current $I_2$ set such that the control region 17 operates as a second gain region. In other words, the control region 17, also, produces optical radiation with a controlled gain by emitting photons. Further, there is defined a saturable absorption region 16 between the gain region 15 and the control region 17. This region 16 changes its transmittance responsive to the optical radiation in the active layer 12 such that the transmittance of the layer 12 is increased responsive to an increase of the optical radiation in the active layer 12 and that the transmittance is decreased responsive to a decrease of the optical radiation in the active layer 12. Furthermore, there is provided a rear side electrode 18 at the bottom of the clad layer 11 for collecting electrical current injected through the first and second electrodes 14a and 14b. Note that a pair of mirrors $E_1$ and $E_2$ are provided at respective ends of the laser diode to form a Fabry-Pérot resonator as usual.

In a typical example, the laser diode has an overall length of 300 μm across the mirrors and the gain region 15 has a length of 192 μm, the saturable absorption region 16 has a length of 38 μm and the control region 17 has a length of 70 μm.

Next, the operation of this prior art optical bistable laser diode and its problems will be described.

In operation, the gain region 15 and the control region 17 are first supplied with the drive current $I_1$ and the control current $I_2$ respectively as already described such that there is photon emission in both of the regions 15 and 17. When the overall gain of the regions 15 and 17 exceeds the loss in the saturable absorption region 16 as well as the loss at the mirrors $E_1$ and $E_2$, the laser starts to oscillate, and when the loss exceeds the gain in the regions 15 and 17, the oscillation of the laser stops. More specifically, in a first optical bistable state corresponding to the optical low level state of the laser diode, the optical radiation established in the active layer 12 as a result of the photon emission in the regions 15 and 17 is insufficient to cause transition of the saturable absorption region from opaque to transparent and no laser oscillation occurs. As a result, only a small optical output due to the electroluminescence is obtained. In the second bistable optical state corresponding to the optical high level state, the saturable absorption region becomes substantially transparent as a result of the strong optical radiation established in the active layer 12 and a large optical output power associated with the decrease of the loss in the saturable absorption region is obtained.

FIG. 2 is a characteristic curve of the laser diode of FIG. 1 showing the optical output as a function of the overall current I injected to the laser diode. This current I is the sum of the drive current $I_1$ and the control current $I_2$ and is first set at a current level $I_B$ as shown in the drawing. The laser diode is turned on by increasing the overall current I beyond a turn-on level $I_{ON}$ and is turned off by decreasing the overall current I below a turn-off level $I_{OFF}$. Such a turn-on and turn-off of the laser diode can be achieved by increasing the control current $I_2$ so that the overall current I exceeds the turn-on level $I_{ON}$ and by decreasing the control current $I_2$ so that the overall current I falls below the turnoff level $I_{OFF}$. In other words, the laser diode is turned on by supplying a set current pulse having a level $I_{ON} - I_B$ or more to the control region 17 in addition to the foregoing current $I_2$ and is turned off by supplying a reset current pulse having a level $I_B - I_{OFF}$ to the control region 17. As the level $I_{ON}$ and $I_{OFF}$ are not identical, there appears a hysteresis which characterizes the bistable operation of the laser diode. Thus, in the turned-on state, the optical output power of the laser diode assumes a level Q corresponding to the optical high level state, while in the turned-off state, the optical output power assumes a level P corresponding to the optical low level state.

Alternatively, the laser diode of FIG. 1 may be turned on by injecting an external optical beam $P_{in}$ having a wavelength chosen so as to cause interaction with the material forming the active layer 12. More specifically, the optical beam $P_{in}$ has a wavelength or an energy which is equal to or larger than the band gap in the active layer 12. In this case, the current $I_1$ and $I_2$ are each set such that the overall current I assumes the level $I_B$ similarly to the foregoing case and the laser diode is triggered by injecting an optical beam. When an optical beam called a set optical pulse is injected, the saturable absorption region 16 absorbs the optical beam and generates carriers. The carriers thus generated are accumulated in the region 16. As a result, the saturable absorption region 16 reduces its absorption coefficient and the region 16 changes from opaque to transparent. Thus, strong laser oscillation is established along with an optical output corresponding to the optical high level state. Further, by applying the reset current pulse already described to the control region 17, the carriers are removed from the region 17 and the oscillation of the laser diode stops because of the loss in the control region 17 which is now depleted of carriers. Note that the saturable absorption region 16 recovers its region transmittance or opacity responsive to a decrease in the optical power in the active layer 12.

In such a prior art optical bistable laser diode, it was necessary to remove the carriers from the control region 17 as quickly as possible in order to obtain a quick turn-off. For this purpose, a very large negative reset current pulse has been used. For example, the current $I_2$ injected to the control region 17 is almost shut down in correspondence to the reset pulse. However, such a large reset pulse causes a strong depletion of carriers in the control region 17 and an excessively large optical power is needed for the set optical pulse to turn on the laser diode, particularly when the laser diode is to be turned on immediately after turn-off. Otherwise, one has to wait for a long time until the carrier density in the active layer 12 returns to a stationary state. This means that there is a dead time responsive to the reset current pulse as illustrated in FIG. 3 as long as an ordinary or small optical power is used for the optical set pulse. Generally, this dead time has a duration in the order of about several nanoseconds and prohibits the high speed operation of the device.

In optical computers and other information processing systems, it is necessary to operate the optical bistable device with a speed as high as possible without using excessive optical power for the set optical pulse, as the use of a large optical power increases the size and power consumption of the system. From this view point, the prior art optical bistable laser diodes are inappropriate for optical computers. An optical bistable device which can be turned on and turned off at a high speed without using large optical power for the set optical beam is strongly demanded.

SUMMARY OF THE INVENTION

Accordingly, it is a general object of the present invention to provide a novel and useful optical bistable laser diode and a method for controlling the same wherein the aforementioned problems are eliminated.

Another and more specific object of the present invention is to provide an optical bistable laser diode having an improved operational speed and a method for controlling the same for obtaining a high operational speed.

Another object of the present invention is to provide an optical bistable laser diode and a method for controlling the same in which the dead time occurring in response to resetting by a reset electrical pulse is substantially reduced without increasing the power of the optical pulse used to turn on the laser diode.

Another object of the present invention is to provide a method for controlling an optical bistable laser diode comprising an active layer sandwiched by a pair of semiconductor clad layers and a tandem electrode structure comprising a first electrode provided on one of the clad layers in correspondence to a gain region defined in the active layer for producing optical radiation with a predetermined optical gain and a second electrode provided on said clad layer in correspondence to a control region defined in the reactive layer for controlling an overall optical gain of the laser diode, there being a saturable absorption region formed in the active layer between said gain region and said control region operable to change its optical absorption coefficient responsive to the optical radiation existing in the active layer, wherein said method comprises the steps of injecting a predetermined drive current to the gain region via said first electrode for establishing said predetermined optical gain therein, applying a predetermined finite voltage via said second electrode to the control region with a voltage level determined such that there is no substantial current flowing through the control region and such that there exists an optical loss in said control region, switching the laser diode to a turn-on state by injecting an optical pulse to the active layer, and switching the laser diode to a turn-off state by applying a voltage lower than said predetermined finite voltage to the control region via the second electrode in a form of reset pulse. According to the present invention, the control region is always operated as a loss region by applying a predetermined voltage determined such that there is no virtual electrical current flowing through the control region. In other words, even when there is a generation of carriers in the control region as a result of the optical radiation supplied thereto from the gain region under the turned-on-state of the laser diode, the generated carriers are immediately dissipated as a current and the loss in the control region is maintained. As a result, the magnitude of change of the carrier density taking place in the control region responsive to the turn-off of the laser diode is reduced to less than about one-tenth of that of the prior art device and the turn-on of the laser diode succeeding to the turn-on is achieved quickly by using a low power optical pulse. Associated therewith, the dead time occurring in response to the reset pulse is reduced without increasing power consumption and the laser diode can be turned on and turned off repeatedly at a substantially high speed.

Another object of the present invention is to provide an optical bistable laser diode comprising an active layer sandwiched by a pair of semiconductor clad layers and a tandem electrode structure comprising a first electrode provided on one of the clad layers in correspondence to a gain region defined in the active layer for producing an optical radiation with a predetermined optical gain and a second electrode provided on said clad layer in correspondence to a control region defined in the active layer for controlling an overall optical gain of the laser diode, there being a saturable absorption region formed in the active layer between said gain region and said control region operable to change its optical absorption coefficient responsive to the optical radiation in the active layer, wherein said laser diode comprises means for applying a predetermined finite voltage to the control region via said second electrode with a voltage level determined such that there is no substantial current flowing through the control region and such that there is an optical loss in said control region, and wherein said laser diode is dimensioned in accordance with the relationship $(L_2+L_3/2)/L \leq 0.3$, where $L_2$ is the length of the control region, $L_3$ is the length of the saturable absorption region and L is the overall length of the laser diode. According to the present invention, the operational speed of the laser diode is increased as a result of the use of a means for applying a finite voltage. Further, the size of the control region which causes the loss is reduced and the excessive decrease in the efficiency of laser oscillation due to the excess loss in the control region is avoided.

Other objects and further features of the present invention will become apparent from the following detailed description when read in conjunction with attached drawings.

DETAILED DESCRIPTION

Figure 4:
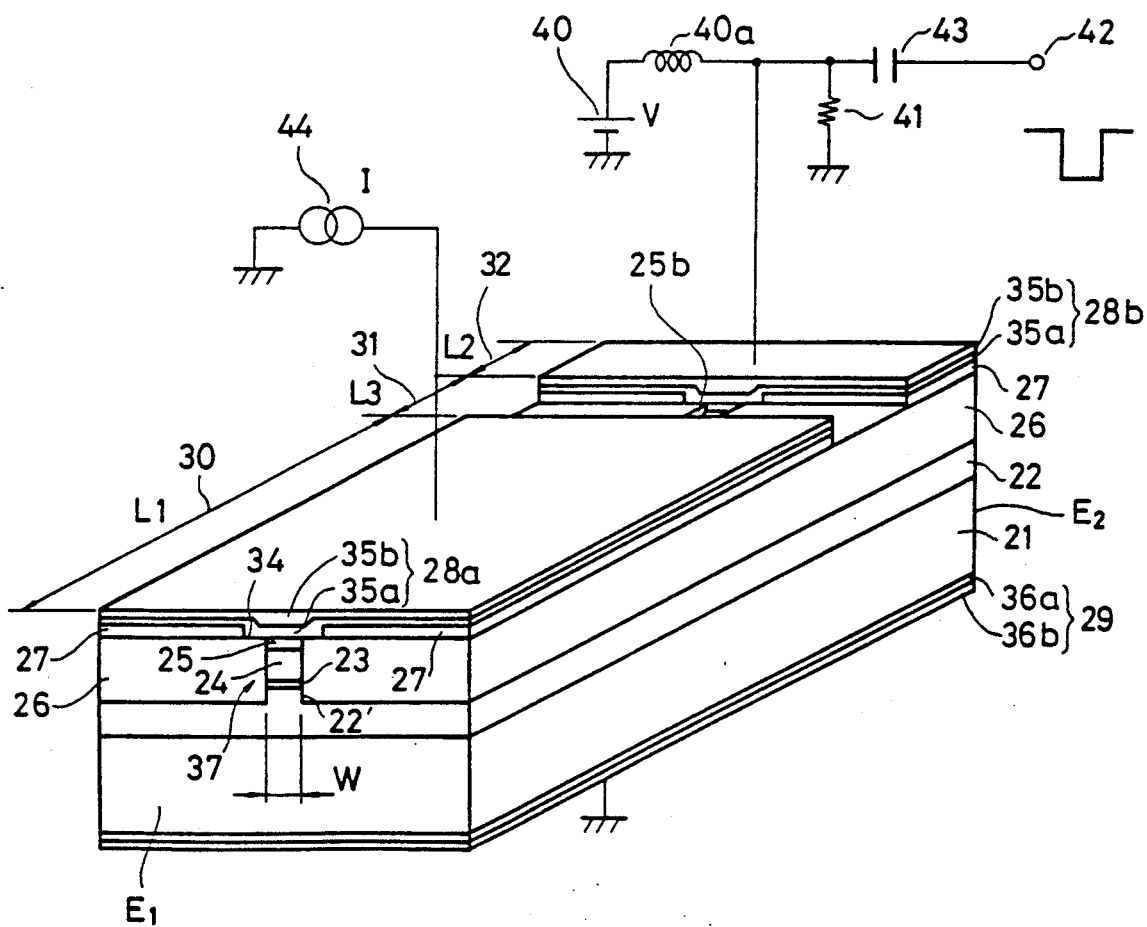
FIG. 4 is a perspective view showing an embodiment of the optical bistable laser diode of the present invention.

FIG. 4 shoWs an embodiment of the optical bistable laser diode of the present invention. Referring to the drawing, the laser diode comprises a substrate 21 of indium phosphide (InP doped to the n-type. The substrate 21 is defined by a front end $E_1$ and a rear end $E_2$ and there is provided a clad layer 22 of InP also doped to the n-type on the substrate 21. The clad layer 22 is formed with a central part 22' extending centrally through the clad layer 22 from the front end $E_1$ to the rear end $E_2$ and having a limited lateral width W, and an active layer 23 of undoped indium gallium arsenide phosphide (InGaAsP) is provided on the central part 22' with a width identical to the width W and extending from the front end $E_1$ to the rear end $E_2$. On the active layer 23, there is provided another clad layer 24 of InP doped to the p-type which extends from the front end $E_1$ to the rear end $E_2$ and which has a lateral width identical to the width W. Further, a contact layer 25 of InGaAsP doped to the p-type is provided on the clad layer 24 so as to extend along the clad layer 24, also with a lateral width identical to the width W. In the illustrated example, the width W is chosen to be 1.5 μm.

Further, a structural part 37 comprising the central par 22' of the clad layer 22, the active layer 23, the clad layer 24 and the contact layer 25 is laterally supported or bounded by a pair of semi-insulating buried layers 26 of indium phosphide. On the structure thus described, there is further provided an insulator film 27 of silicon oxide ($SiO_2$) which covers the entire structure except for a central part or opening 34 extending along the foregoing structural part 37. In other words, the contact layer 25 is exposed along the central opening 34.

Furthermore, a first electrode 28a is provided on a first region of the buried layer 26 adjacent first end $E_1$ for making contact with the exposed contact layer 25, and a second electrode 28b is provided on a second region of the buried layers 26 adjacent rear end $E_2$ for also making contact with the exposed contact layer 25. Also, a back-side electrode 29 is provided on the bottom of the substrate 21. The electrodes 28a and 28b are each formed so as to make an ohmic contact with the p-type contact layer 25 and each comprises a stacking of a first layer 35a of titanium and platinum and a second layer 35b of gold. The electrode 29 on the other hand comprises a first layer 36a which comprises a stacking of gold-geranium alloy and gold and a second layer 36b of gold and electrode 29 makes an ohmic contact with the n-type substrate 21. Further, a respective mirror $E_1'$, $E_2'$ is formed at each of ends $E_1$ and $E_2$ of the laser diode as usual. The mirrors may be formed by polishing or simply cleaving the ends $E_1$, $E_2$. In order to avoid short circuit conduction across the electrodes 28a and 28b through the contact layer 25, a part of the contact layer 25 which corresponds to the saturable absorption region 31 is removed as illustrated by the numeral 25b.

In the laser diode of FIG. 4, the first and second electrodes 28a and 28b form a tandem electrode structure and in correspondence to the first electrode 28a, a gain region 30 is provided in the active layer 23 for producing optical radiation with a predetermined optical gain by emitting photons into the active layer. For this purpose, a constant current source 44 is connected to the electrode 28a. Further, a control region 32 is formed in the active layer 23 in correspondence to the second electrode 28b for controlling the overall gain of the laser diode by absorbing photons. In the gain region 30, a drive current is supplied from the constant current source 44 via the first electrode 28a with a level sufficient to cause laser oscillation. In the control region 32, on the other hand, a finite voltage V set to a level such that there is no substantial current flowing through the region 32 is supplied through the second electrode 28b. As there is no substantial electrical current flowing through the control region 32, there is no photon emission in the control region 32 and the region 32 acts as a loss region In order to establish the control region 32 as such, the laser diode of the present invention uses a drive current 40 which operates as a constant voltage source producing the foregoing control voltage V. This constant voltage source 40 is connected to the second electrode 28b via a choke coil 40a. Further, a resistor 41 having a small resistance is connected for impedance matching. Because of the drive current 40 and the resistor 41, carriers formed in the control region 32 as a result of absorption of optical radiation are immediately dissipated to the ground and the control region 32 always acts as a loss region.

Between the first and second electrodes 28a and 28b, there is formed a saturable absorption region 31 which changes the absorption coefficient or transmittance responsive to the optical radiation existing in the active layer 23 similarly to the saturable absorption region 16 of the prior art device. Thus, the saturable absorption region 31 becomes transparent when there is sufficient optical power in the active layer 23. Thus, when a set optical pulse is injected into the active layer 23 transition from opaque to transparent occurs in the saturable absorption region 31 and as a result, the state of the laser diode of FIG. 4 is switched bistably to a high optical level state.

In the optical bistable laser diode of the present invention, it is preferred that the control region 32 acting as the loss region be as small as possible so as to obtain efficient laser oscillation. If the control region 32 is too large, not only does the turn-on of the laser diode become difficult, but also optical bistability due to the saturable absorption region 32 is lost because of excess losses in the control region 31. In the present invention it was found that the laser diode performs an optical bistable operation effectively when the following relationship is satisfied:

$$(L2+L3/2)/(L1+L2+L3) \leq 0.3,$$

where L1 is the length of the gain region 30, L2 is the length of the control region 32 and L3 is the length of the saturable absorption region 32. In one preferred example the length L1 was 256 μm, the length L2 was 16 μm and the length L3 was 28 μm. In this case, $$(L2+L3/2)/L = 0.1$$

where $L = L1 + L2 + L3$.

By taking the length L3 as such, there is secured a resistance of about 8 kΩ between the first and second electrodes 28a and 28b and interference between the gain region 30 and the control region 32 is avoided. Note that the buried layer 26 of indium phosphide which connects the first electrode 28a and the second electrode 28b electrically has a large resistivity ($> 10^8 \Omega$ cm).

Next, the principle of operation of the optical bistable laser diode of the present invention will be described.

Figure 5:
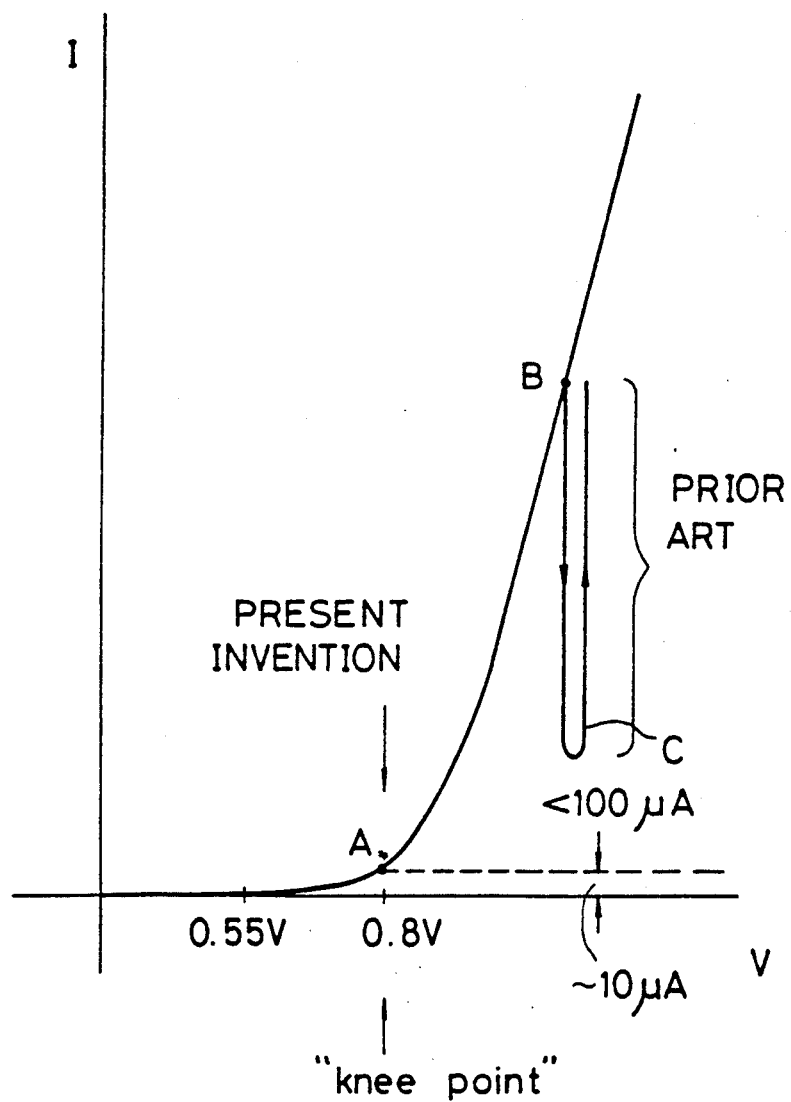
FIG. 5 is a characteristic curve of a p-n junction used in the laser diode FIG. 4.

FIG. 5 illustrates the voltage versus current characteristic curve of the control region 32. As the laser diode has a p-n junction therein the voltage verses current characteristic curve has a feature pertinent to the p-n junction of the diode in which the current increases steeply when the voltage V applied to the second electrode 28b exceeds a predetermined level. Such point of steep current rise is represented in FIG. 5 by point A and will be referred to as the "knee point". The voltage at the knee point A is related to the diffusion potential of the p-n junction which generally has a value of about 0.8 volts. The current flowing through the diode at the knee point A is, in the case of the material used for the control region 32, less than 100 μA. In correspondence to the knee point, voltage of about 0.55 volts is applied to the second electrode 28b. The current corresponding to this voltage is about 10 μA. Under such a condition, there is substantially no emission of photons in the control region 32 and the region acts as a loss region causing absorption of optical radiation passing therethrough. As already noted, the carriers formed in the control region 32 are immediately dissipated through the resistor 41 as well as through the voltage source 40 as a result of absorption of optical radiation and the control region is maintained as a loss region. In one example, the resistor 41 has a resistance of 50 Ω.

Figure 1:
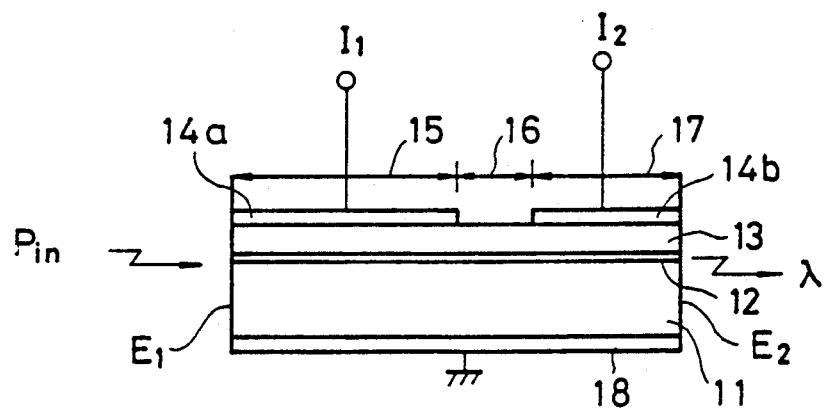
FIG. 1 is a cross-sectional view showing the structure of a prior art optical bistable laser diode.

FIG. 5 also illustrates the operational point of the prior art laser diode by a point B. Note that the current $I_2$ injected into the control region 17 of the device of FIG. 1 is much larger than the current injected into the control region 32 of the device of FIG. 4. Associated therewith, the prior art device needs a large reset current pulse to reset the laser diode as shown by loop C.

In operation, a drive current I having a level sufficient to cause oscillation of the laser diode is supplied to the gain region 30 through the first electrode 28a. As will be described later, the level of the current I is set at the center of the hysteresis curve characterizing the optical bistability. In one example, a current of about 45.5 mA is applied to the gain region 30 as the current I. Further, a voltage V corresponding to one half of the voltage of the knee point A on the voltage versus current characteristic curve for the control region 32 is applied to the second electrode 28b. Because of the loss in the control region 32, the laser diode does not start oscillation spontaneously even when the current I is supplied at a level capable of causing laser oscillation.

To turn the laser diode on, an optical pulse called a set optical pulse is injected into the active layer 23 from outside. This set optical pulse has a wavelength close to or equal to the oscillation wavelength of the laser diode and thus interacts with the material forming the active layer 23. Responsive thereto, carriers comprising holes and electrons appear in the saturable absorption region 31 as well as in the control region 32. The carriers formed in the control region 32 are immediately dissipated through the second electrode 28b as already noted and the control region 32 continues to act as a loss region. On the other hand, carriers are not removed from the saturable absorption region 31 and the absorption coefficient is decreased in the region 31 responsive to the injection of the set optical pulse. In other words, the loss in the saturable absorption region 31 is reduced as a result of the injection of the set optical pulse. Thus, when the gain in the gain region 30 exceeds the overall loss caused in the saturable absorption region 31 and in the control region 32 as well as at the mirrors $E_1$ and $E_2$, the laser diode starts to oscillate and the output power is increased rapidly until it reaches a high optical level state. Note that loss in the saturable absorption region 31 rapidly decreases once sufficient optical radiation is established in the active layer 23. Thus, the power of the optical radiation increases steeply when the laser oscillation is started.

Because the longitudinal length $L_2$ of the control region 32 is set to be small as already described, the oscillation of the laser diode occurs easily and efficiently even though the control region 32 continues to act as a loss region in the oscillating state. The laser diode continues its high optical state even after the set optical pulse is removed Next, transition of the laser diode from the turned-on state to the turned-off state will be described.

To turn off the laser diode, the loss in the control region 32 is increased such that the overall loss of the laser diode exceeds the gain in the gain region 30. For this purpose, a reset voltage pulse of about $-0.25$ voltage is applied to the electrode 28b through an input terminal 42 and a blocking capacitor 43. Responsive thereto, the carrier density in the control region 32, which is already small in the turned-on state, is reduced further and the loss in the control region 32 is increased.

Figure 6:
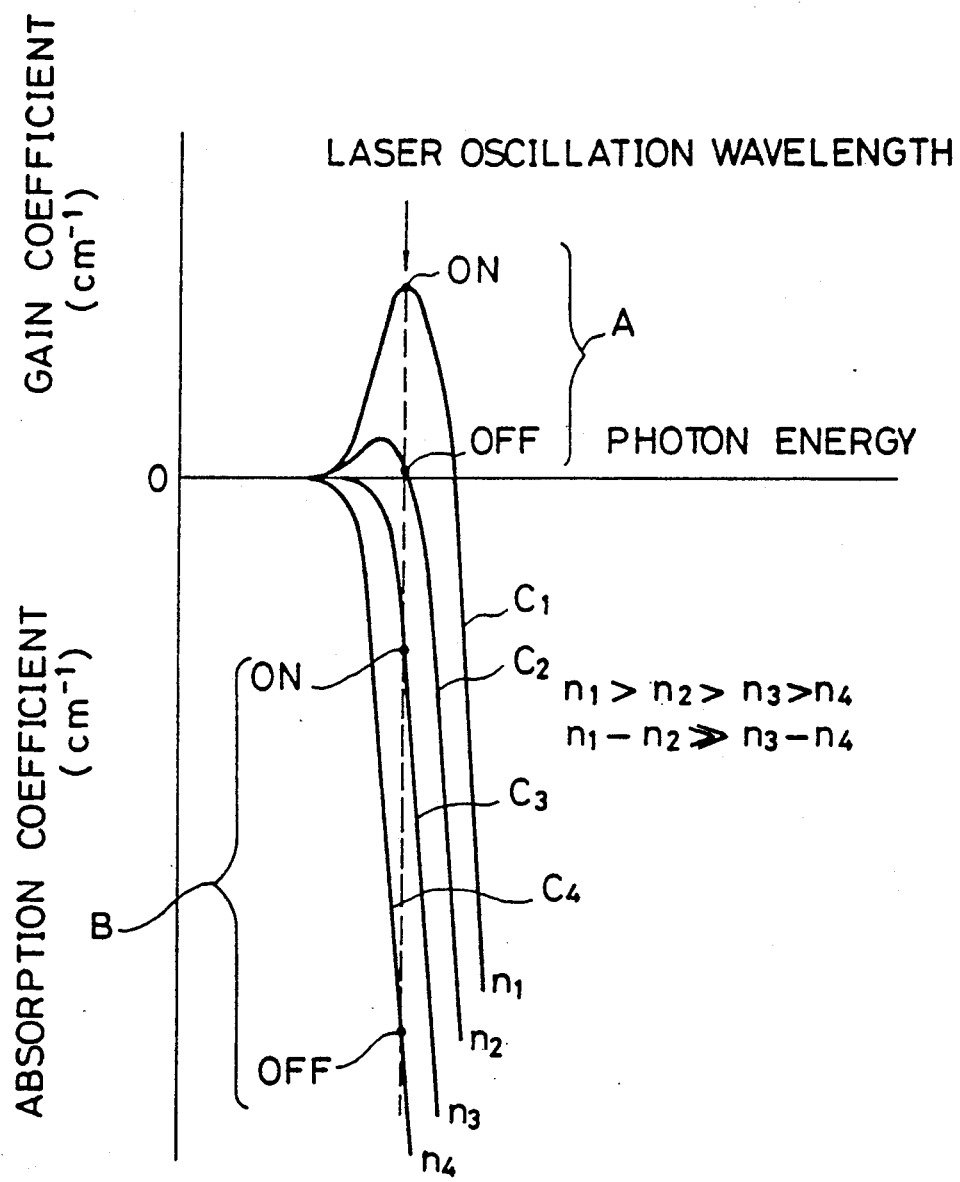
FIG. 6 is a diagram showing the change of gain coefficient and absorption coefficient responsive to the change of carrier density in the semiconductor material used o in the devices of FIGS. 1 and 4.

FIG. 6 illustrates the relationship between the gain or absorption coefficient of the material forming the control region and the carrier density therein for the optical bistable laser diode of the prior art and of the present invention. In the drawing, curve $C_1$ represents the turned-on state of the prior art optical bistable laser diode shown in FIG. 1. As can be seen in the drawing, gain is at its peak at the wavelength of laser oscillation when there exists a large carrier density $n_1$ which may be above $10^{-18}$ cm$^{-3}$ in correspondence to the drive current $I_2$. On the other hand, curve $C_2$ represents the state in which the laser diode is turned off and the carrier density is reduced to $n_2$ responsive to the reset current pulse. In this state, the gain of the control region 17 of the device of FIG. 1 is reduced to substantially zero. As already noted, the reset current pulse removes carriers more or less completely from the control region 17 so as to obtain quick turn-off. The problem of long dead time is associated with the foregoing phenomena.

Curve $C_3$, on the other hand, represents the turn-on state of the laser diode of the present invention wherein the carrier density $n_3$ in the control region 32 corresponds to the voltage V applied to the electrode 28b. Note that the carrier density $n_3$ is significantly smaller than the carrier density $n_2$ and the control region 32 of the device of FIG. 4 operates as a loss region even in the turned-on state of the laser diode. Further, curve $C_4$ represents the state in which the foregoing reset voltage pulse is applied to the electrode 28b so as to remove carriers from the control region 32. Responsive thereto, the carrier density is reduced from $n_3$ to $n_4$. This change of the carrier density from the level $n_3$ to $n_4$ is far smaller than the change from the level $n_1$ to $n_2$ because the initial current density $n_4$ is already set at a very small level. The density level $n_4$ may be $10^{-17}$ cm$^{-3}$, for example. The foregoing relationships are summarized as $$n_1 > n_2 > n_3 > n_4,$$

and $$n_1 - n_2 >> n_3 - n_4.$$

Referring to FIG. 6 again, it will be noted that the change of absorption coefficient caused in the case of the present invention is much larger than the corresponding change of gain in the prior art device. This change of the absorption coefficient is caused by changing the carrier density from $n_3$ to $n_4$, a change of a magnitude which is smaller by a factor of ten or more than the magnitude of the carrier density change from $n_1$ to $n_2$. In other words, a large loss is induced in the control region 32 responsive to a minute decrease of the carrier density from $n_3$ to $n_4$ and the oscillation of the laser diode is immediately stopped. Since the change of the carrier density associated with the reset voltage pulse is minute in the case of the present invention, the recovery of the carrier density $n_3$ after the removal of the rest voltage pulse is achieved easily and the laser diode can be turned on again immediately after the turn-off by an optical set pulse having a small optical power.

Figure 7B:
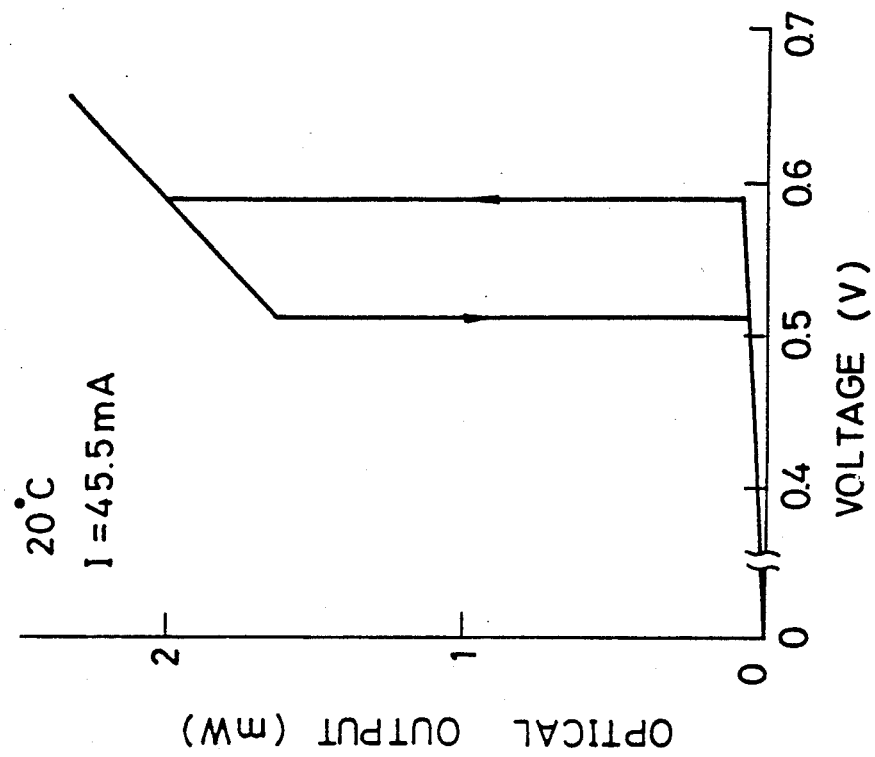
FIGS. 7(A) and (B) are diagrams showing the relationship between optical output power and injected current and the relationship between optical output power and applied voltage for the laser diode of FIG. 4.
Figure 7A:
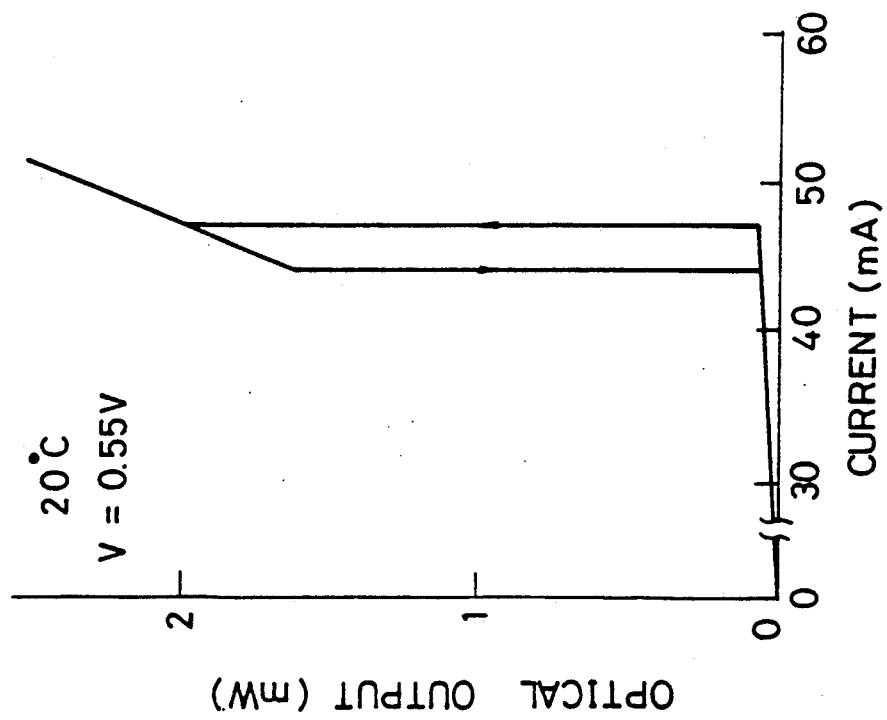

FIGS. 7(A) and (B) shown hysteresis curves pertinent to the operational characteristics of the laser diode of the present invention. In this regard, FIG. 7(A) illustrates the relationship between changes in the conditions where there is no external optical injection and a constant voltage of 0.55 volts is applied to the second electrode 28b as the voltage V. Under these conditions, the hysteresis loop is obtained by increasing and decreasing the current I supplied to the first electrode 28a above and then below a current level of 45.5 mA which corresponds to the center of the hysteresis curve. In this case, the width of the hysteresis loop for the current I is about 3 mA.

FIG. 7(B) illustrates the case wherein a constant current of 45.5 mA is supplied to the gain region through the first electrode 28a as the current I, and the voltage V applied to the second electrode 28b is increased and then decreased above and below a voltage level of 0.55 volts. Similarly to the case of FIG. 7(A), there is no external optical injection to the laser diode. As can clearly be seen in FIG. 7(B), the laser diode is turned on responsive to an increase of the voltage V to above about 0.59 volts and is turned off responsive to a decrease of the voltage V to below about 0.51 volts.

Figure 8:
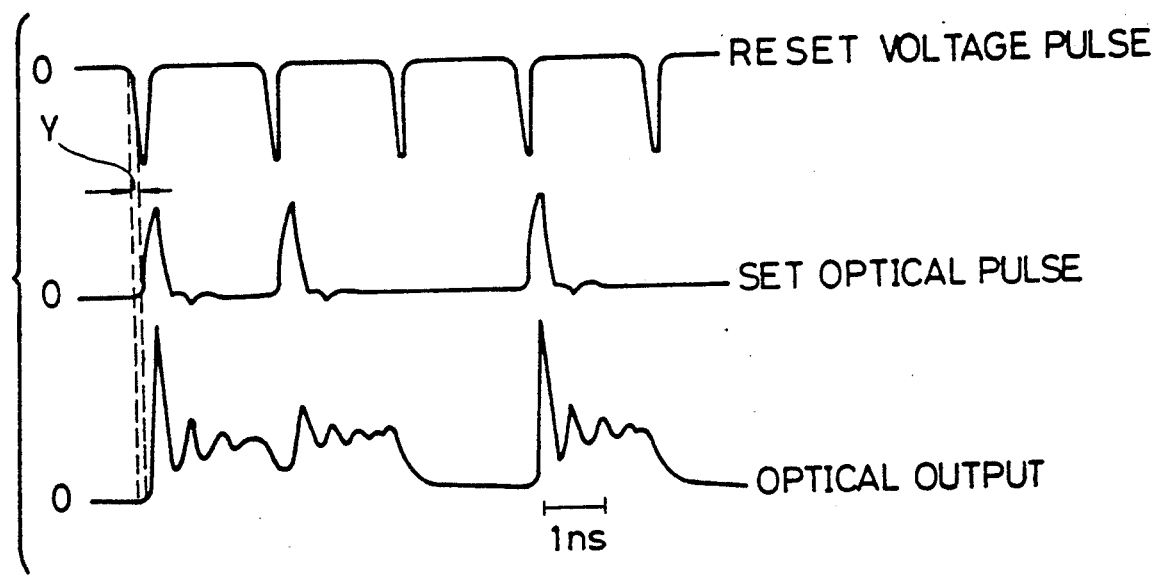
FIG. 8 is a waveform chart showing the optical response of the laser diode of FIG. 4 responsive to the reset voltage pulse and an optical set pulse.

FIG. 8 shows the results of an experiment undertaken to evaluate the response of the laser diode of FIG. 4 by providing set optical pulses and reset voltage pulses alternately. In the illustrated experiment, the laser diode was driven by setting the current I at 45.5 mA in correspondence to the center of the hysteresis loop and by setting the voltage V at 0.55 volts. Further, the laser diode was reset or turned off each time a new operational cycle was started by applying a negative voltage pulse having an amplitude of $-0.25$ volts as the reset voltage pulse. In other words, the voltage at the second electrode 28b was momentarily reduced to 0.30 volts in correspondence to the reset voltage pulse. The reset voltage pulse used for the experiment had a pulse width of 200 picoseconds and a frequency of 500 MHz.

Further, in order to turn the laser diode on, an optical pulse having a wavelength of 1.307 μm and optical power of 390 μW was applied as the set optical pulse with a pulse width of 200 picoseconds. The set optical pulse was provided in correspondence to a series of binary digits "1", "1", "0" and "1" in the illustrated example. As can be seen in FIG. 8, the laser diode operated properly even when the time interval between the reset voltage pulse and the optical set pulse was reduced to below 1 nanosecond. In prior art devices, this time interval cannot be reduced below several nanoseconds because of the excessive increase of optical power of the optical set pulse.

Figure 9A:
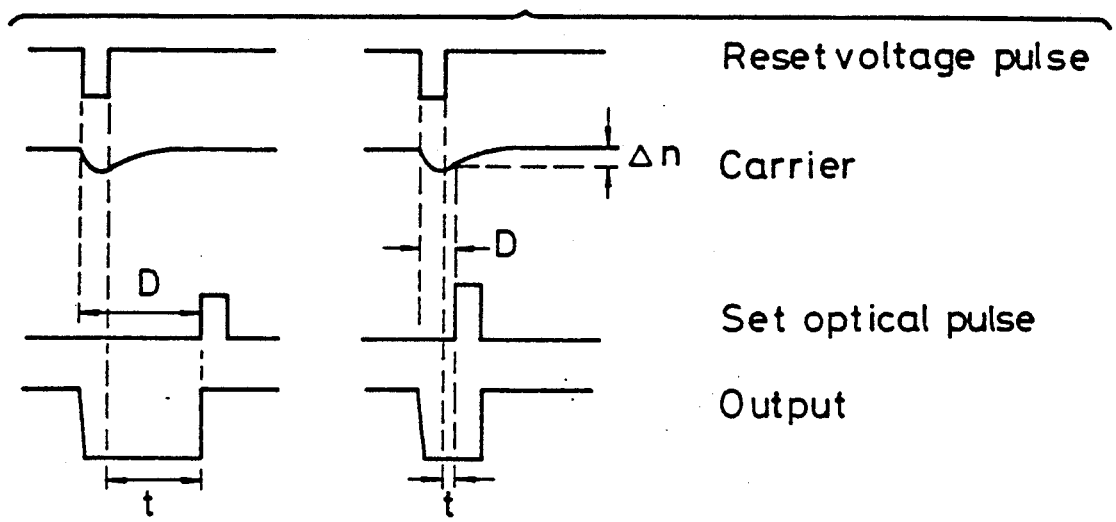
FIGS. 9(A) and (B) are waveform charts showing the reduced dead time for the present invention and the prolonged dead time for the prior art device.
Figure 9B:
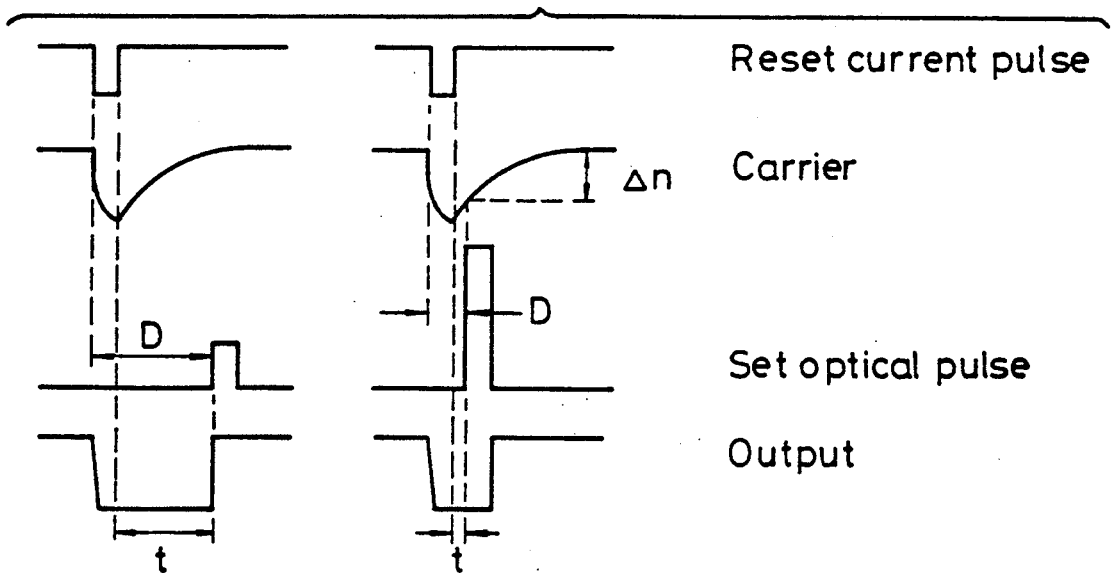

FIGS. 9(A) and (B) compare the time interval needed for the laser diode to become operational after the voltage pulse or current pulse for resetting the laser diode is removed. In FIG. 9(A) corresponding to the laser diode of the present invention, it can be seen that the change of the carrier density responsive to the reset voltage pulse is very small and the laser diode can be turned on after a previous turn-off by injecting an optical set pulse having a very small optical power. Even when the time interval between the reset voltage pulse and the set optical pulse or dead time D is small, the optical power needed for the set optical pulse is only slightly increased. In FIG. 9(B) corresponding to the prior art laser diode, on the other hand, there is a significant change of carrier density responsive to the large reset current pulse and a large optical power is needed for the set optical pulse in order to turn on the laser diode subsequently to a previous turn-off Note that the optical power needed to turn on the laser diode increases steeply with a decrease of the dead time D. Responsive to the decrease of the dead time D, the waiting time of the device, which is represented by the interval t between the trailing edge of the reset voltage pulse or reset current pulse and the leading edge of the next set optical pulse, is decreased significantly by operating the laser diode according to the control method disclosed heretofore.

Figure 10:
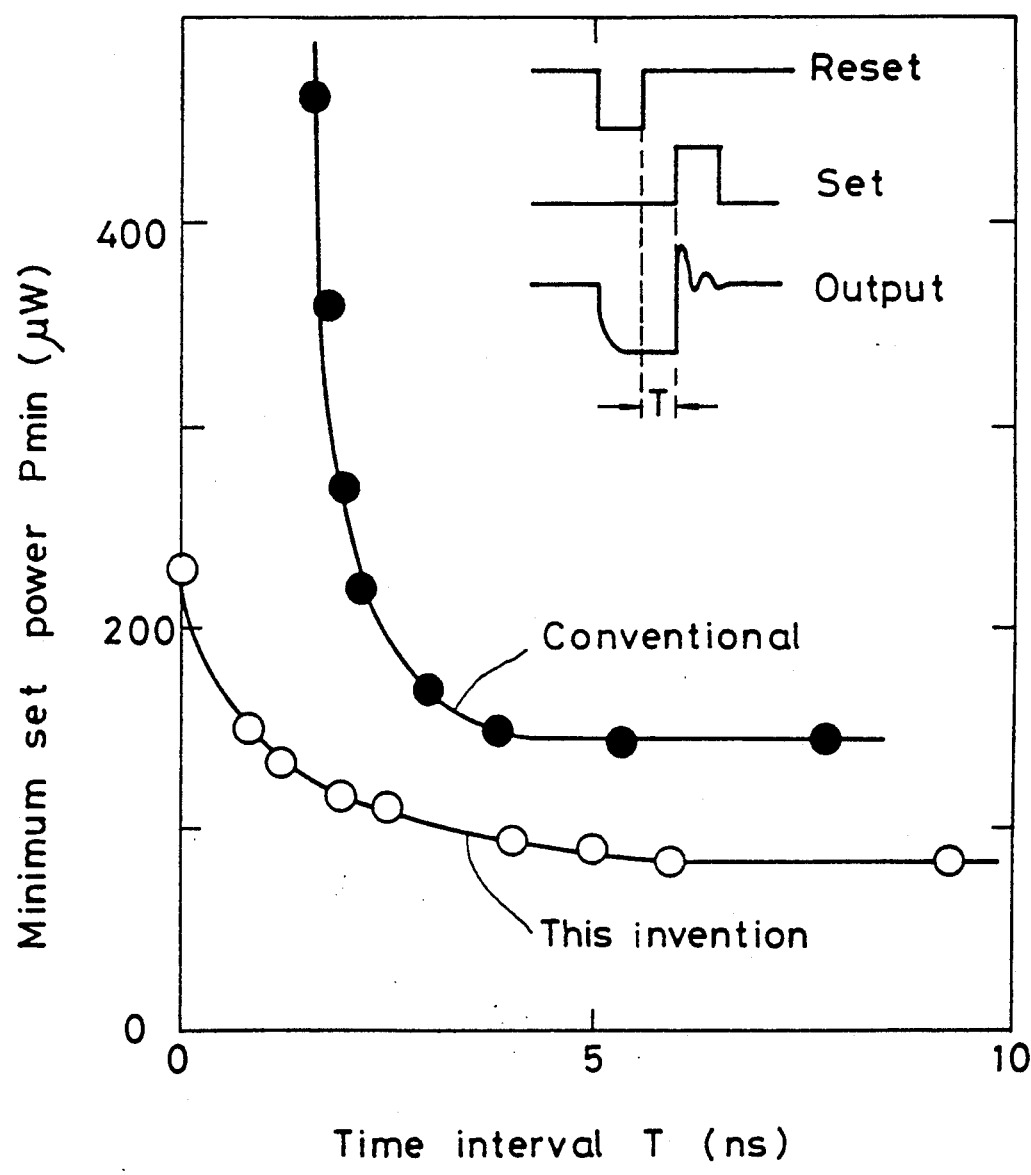
FIG. 10 is a graph showing the reduction of the recovery time achieved by the present invention in comparison with the prior art device.

FIG. 10 shows the relationship between the waiting time T and the minimum optical power needed for the set optical pulse to turn on the laser diode As represented by the solid circles in the drawing, the power needed for the set optical pulse increases sharply in the case of the prior art laser diode when the time interval is decreased below a few nanoseconds Clearly, a decrease of the time interval T to below about two or three nanoseconds is impossible in the prior art device because of the excessive increase of the optical power needed for the set optical pulse. On the other hand, the relationship for the present invention, as represented in the drawing by open circles, clearly shows that the time interval T can be reduced to zero even through there is a slight increase in the optical power for the optical set pulse. Thus, the laser diode of the present invention, controlled as described heretofore, responds almost immediately whenever the reset voltage pulse is removed, and thus, the speed of operation is improved significantly. Such an improvement enables the use of high block frequency when the laser diode is used as an optical logic device.

Finally, the steps for manufacturing the laser diode of FIG. 4 are described briefly with reference to FIGS. 11(A)–(D).

Figure 11A:
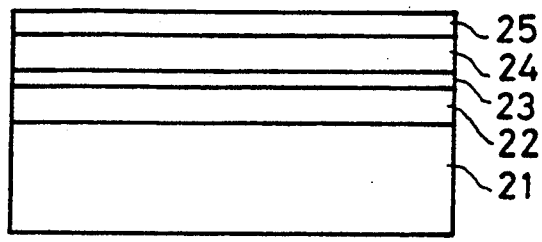
FIGS. 11(A)–(D) are diagrams showing the steps of manufacturing the laser diode FIG. 4.
Figure 11B:
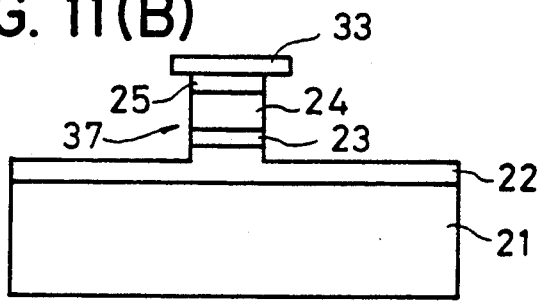
Figure 11C:
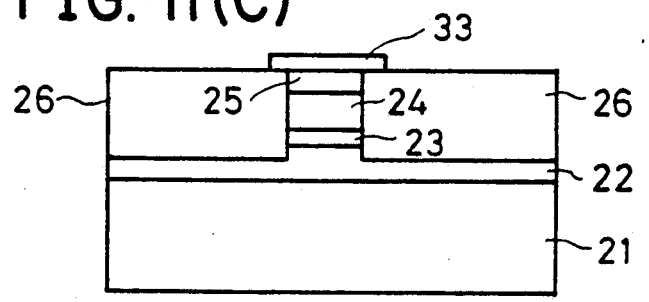
Figure 11D:
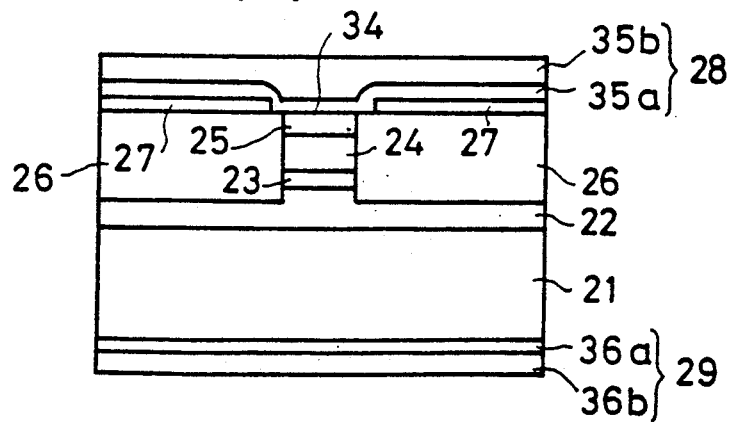

First, the clad layer 22, active layer 23, second clad layer 24 and contact layer 25 are grown on the substrate 21 by liquid phase epitaxy (LPE) with a thickness of 2.0 $\mu$m for the clad layer 22, 0.15 $\mu$m for the active layer 23, 1.5 $\mu$m for the clad layer 24 and 0.3 $\mu$m for the contact layer 25 to form a structure as shown in FIG. 11(A). Next, the insulator film 33 is provided on the contact layer 25 with a thickness of 3000 Å. This film 33 is then patterned photolithographically such that the film 33 extends along the center of the structure FIG. 11(A) from the end $E_1$ to the other end $E_2$ (See FIG. 4) with a width of 4.0 $\mu$m. Next, using the film 33 as the mask, the structure of FIG. 11(A) is subjected to etching until the etching reaches the top part of the clad layer 22. As a result, a structure as shown in FIG. 11(B) is obtained wherein the layers 23–25, as well as the top part of the clad layer 22, are removed except for the central part 37 which is protected by the insulator film 33. During this procedure, the width of the central part 37 is reduced to 1.5 $\mu$m by etching which acts also laterally to some extent. Next, a buried layer 26 having high resistivity is formed at each side of the central part 37 by growing indium phosphide doped with iron by metal-organic chemical vapor (MOCVD) for a thickness of 2.5 $\mu$m to form a structure shown in FIG. 11(C).

Next, the insulator film 33 is removed and an insulator film 27 is deposited thereon with a uniform thickness of 3000 Å. The insulator film 27 is then subjected to selective etching to form the opening 34 extending along the central part 37 from the end $E_1$ to the other end $E_2$ (FIG. 4). As a result of the opening 34, the contact layer 25 is exposed Next, the metal layer 35a, which in turn comprises a stacking of a titanium layer having a thickness of 1000 Å, is deposited on the structure thus obtained by electron beam deposition. The structure is then heat treated at 430° C. for 30 minutes. Further, a 2 $\mu$m-thick gold layer is plated selectively on the metal layer 35b except for the region corresponding to the saturable absorption region. 31. Thus, the metal layer 35b is provided only in correspondence to the gain region 30 and the control region 32. Further, the metal layer 35a and the insulator film 37 corresponding to the saturable absorption region 31 is selectively removed by reactive ion etching (RIE) using argon gas for platinum and carbon tetrafluoride (CF$_4$) for titanium to expose the top of the buried layer 26 as well as the contact layer 25. This contact layer 25 in the saturable absorption region 31 is further removed by selective etching.

Further, the thickness of the substrate 21 is adjusted by removing the bottom of the substrate such that the substrate 21 has a thickness of 100 $\mu$m, and the metal layer 36a which comprises a gold-geranium alloy layer with a thickness of 2000 Å and a gold layer with a thickness of 300 Å are deposited on the bottom of the substrate 21 thus prepared. The structure is then heat treated at 380° C. for one minute and is further covered by another gold layer corresponding to the metal layer 36b is deposited on the metal layer 36a and the structure shown in FIG. 11(D) corresponding to the device shown in FIG. 4 is completed.

Further, the present invention is not limited to these foregoing embodiments but various variations and modifications may be made without departing from the scope of the present invention.

What is claimed is:

1. A method for controlling an optical bistable laser diode having an active layer sandwiched between a pair of clad layers with a gain region defined in the active layer for producing optical radiation, a saturable absorption region defined in the active layer adjacent to the gain region for transmitting the optical radiation produced in the gain region and having variable loss characteristics which change responsive to the power of the optical radiation, and a control region defined in the active layer adjacent to the saturable absorption region for receiving the optical radiation from the saturable absorption region and transmitting it with a controlled gain, comprising steps of:

injecting a predetermined drive current to the gain region at a level capable of causing bistable operation of the laser diode to establish said optical radiation in the gain region;

applying a predetermined finite voltage to the control region at a level equal to or lower than the characteristic voltage level above which the current flow through the control region is increased steeply and below which substantially no current flows through the control region and thereby inducing an optical loss in the control region;

switching the laser diode to a turn-on state by injecting an optical pulse to the active layer;

and switching the laser diode to a turn-off state by applying a voltage lower than said predetermined finite voltage to the control region in the form of a reset voltage pulse.

2. A method as claimed in claim 1 in which said finite voltage is determined generally equal to the diffusion potential established between the material forming said clad layers and the material forming the active layer.

3. A method as claimed in claim 1 in which said finite voltage is determined such that the current flowing through the control region is 100 $\mu$A or less.

4. An optical bistable laser diode comprising:
   an elongated active semiconductor element having opposed, longitudinally extending upper and lower surfaces and a pair of longitudinally spaced ends;
   a first elongated semiconductor clad layer on said lower surface;
   a second elongated semiconductor clad layer on said upper surface, said second layer being coextensive in length with said active semiconductor element and having a first end located at one end of the active element and a second end at the other end of the active element;
   a respective reflection means provided at each end of the active semiconductor element for forming a resonator in the active element;
   a first elongated electrode on said second semiconductor clad layer and extending therealong from said one end thereof and toward the other end thereof for a first distance $L_1$;
   a second elongated electrode on said second semiconductor clad layer and extending therealong from said other end thereof and toward said one end thereof for a second distance $L_2$; and a back-side electrode electrically coupled to said first elongated semiconductor clad layer, said electrodes being in longitudinal alignment on said second semiconductor layer and being spaced apart a distance $L_3$ presenting a gap region therebetween defining a saturable absorption region in the active semiconductor layer at said gap region, said distances $L_1$, $L_2$ and $L_3$ satisfying the relationship $$(L_2+L_3/2)/(L_1+L_2+L_3) \leq 0.3.$$

5. An optical bistable laser diode as set forth in claim 4, wherein said distances $L_1$, $L_2$ and $L_3$ satisfy the relationship $$(L_2+L_3/2)/(L_1+L_2+L_3) \approx 0.1.$$

6. An optical bistable laser diode as set forth in claim 4, wherein said active semiconductor element has a pair of laterally spaced, longitudinally extending sides and said diode further comprises a respective, elongated semi-insulating semiconductor element member extending along the active semiconductor at each of said sides for lateral confinement of optical radiation formed in the active semiconductor element.

7. An optical bistable laser diode as set forth in claim 4, further comprising a respective layer of doped semiconductor material disposed between each of said electrodes and said second clad layer for improving electrical contact therebetween.

8. An optical bistable laser apparatus comprising:
an elongated active semiconductor element having opposed, longitudinally extending upper and lower surfaces and a pair of longitudinally spaced ends;
a first elongated semiconductor clad layer on said lower surface;
a second elongated semiconductor clad layer on said upper surface, said second layer being coextensive in length with said active semiconductor element and having a first end located at one end of the active element and a second end at the other end of the active element;
a respective reflection means provided at each end of the active semiconductor element for forming a resonator in the active element;
a first elongated electrode on said second semiconductor clad layer and extending therealong from said one end thereof and toward the other end thereof for a first distance $L_1$;
a second elongated electrode on said second semiconductor clad layer and extending therealong from said other end thereof and toward said one end thereof for a second distance $L_2$,
said first and second electrodes being in longitudinal alignment on said second semiconductor layer and being spaced apart a distance $L_3$ presenting a gap region therebetween defining a saturable absorption region in the active semiconductor layer at said gap region;
a back-side electrode electrically coupled to said first elongated semiconductor clad layer;
first biasing means connected to said first electrode and said back-side electrode for injecting a current to said first electrode at a level capable of causing laser oscillation;
second biasing means connected to said second electrode and said back-side electrode for applying a bias voltage to said second electrode at a level such that no substantial current flows through the active semiconductor element and such that a part of the active element immediately underneath said second electrode acts as an optical absorption region where optical radiation passing therethrough is absorbed, the absorption characteristics of said active element being such that absorption at said region increases with decreasing bias voltage; and
control means for controlling the second biasing means such that the bias voltage may be decreased to increase optical absorption at said region and thereby stop laser oscillation.

9. An optical bistable laser diode as set forth in claim 8, wherein said distances $L_1$, $L_2$ and $L_3$ satisfy the relationship $$(L_2+L_3/2)/(L_1+L_2+L_3) \leq 0.3.$$

10. An optical bistable laser apparatus as set forth in claim 8, wherein said second biasing means includes means for passing carriers formed in the optical absorption region to the ground.

11. An optical bistable laser apparatus as set forth in claim 8, wherein said second biasing means comprises a constant voltage source and a choke coil connected in series.

12. An optical bistable laser diode, comprising:
a first semiconductor clad layer;
a second semiconductor clad layer;
an active semiconductor layer provided so as to be sandwiched between said first and second semiconductor clad layers and defined by a first end and an opposing second end;
reflection means provided on said first and second ends so as to form a resonator in the active semiconductor layer;
first and second electrodes provided on said second semiconductor clad layer substantially in alignment in a direction connecting the first end and the second end;
a gap region defined between the first and second electrodes, said gap region defining a saturable absorption region in a part of said active semiconductor layer located underneath; and p1 a back-side electrode electrically coupled to said first semiconductor clad layer,
wherein said first electrode, said second electrode and said gap region respectively have lengths L1, L2 and L3 measured along said direction satisfying a relation $$(L2+L3/2)/(l1+L2+L3) \leq 0.3.$$

13. An optical bistable laser diode as claimed in claim 12 in which said lengths L1, L2 and L3 substantially satisfy a relation $$(L2+L3/2)/(L1+L2+L3) \approx 0.1.$$

14. An optical bistable laser diode as claimed in claim 12 in which said active semiconductor layer is laterally bounded by a pair of another semi-insulating semiconductor layers for lateral confinement of an optical radiation formed in the active semiconductor layer.

15. An optical bistable layer diode as claimed in claim 12 further comprising a contact layer of semiconductor layer doped to the second conduction type between said second semiconductor clad layer and said first electrode and between said second semiconductor clad layer and said second electrode for improving electrical contact.

16. An optical bistable laser apparatus, comprising:
a first semiconductor clad layer;
a second semiconductor clad layer;

an active semiconductor layer provided so as to be sandwiched between said first and second semiconductor clad layers and defined by a first end and an opposing second end;

reflection means provided on said first and second ends so as to form a resonator in the active semiconductor layer;

first and second electrodes provided on said second semiconductor clad layer substantially in alignment in a direction connecting the first end and the second end;

a gap region defined between the first and second electrodes, said gap region defining a saturable absorption region in a part of said active semiconductor layer located underneath;

a back-side electrode electrically coupled to said first semiconductor clad layer, first biasing means for injecting a current to said first electrode with a level capable of establishing a laser oscillation;

second biasing means for applying a bias voltage to said second electrode with a level such that a part of the active layer immediately underneath said second electrode acts as an optical loss region by providing an optical loss to an optical radiation passing therethrough; and control means for controlling the bias voltage such that the optical loss in said optical loss region is increased and the laser oscillation is stopped, wherein said first electrode, said second electrode and said gap region respectively have lengths L1, L2 and L3 measured in said direction satisfying a reaction $$(L2 + L3/2)/(L1 + L2 + L3) \leq 0.3.$$

17. An optical bistable laser apparatus as claimed in claim 16 in which said second biasing means passes a carrier formed in said optical loss region to the ground.

18. An optical bistable laser apparatus, comprising:
a first semiconductor clad layer;
a second semiconductor clad layer;
an active semiconductor clad layer;
an active semiconductor layer provided so as to be sandwiched between said first and second semiconductor clad layers and defined by a first end and an opposing second end;

reflection means provided on said first and second ends so as to form a resonator in the active semiconductor layer;

first and second electrodes provided on said second semiconductor clad layer substantially in alignment in a direction connecting the first end and the second end;

a gap region defined between the first and second electrodes, said gap region defining a saturable absorption region in a part of said active semiconductor layer located underneath;

a back-side electrode electrically coupled to said first semiconductor clad layer, first biasing means for injecting a current to said first electrode with a level capable of establishing a laser oscillation;

second biasing means for applying a bias voltage to said second electrode with a level such that a part of the active layer immediately underneath said second electrode acts as an optical loss region by providing an optical loss to an optical radiation passing therethrough; and control means for controlling the bias voltage such that the optical loss in said optical loss region is increased and the laser oscillation is stopped, wherein said second biasing means comprises a constant voltage source and a choke coil connected in series.

* * * * *

UNITED STATES PATENT AND TRADEMARK OFFICE
CERTIFICATE OF CORRECTION

PATENT NO. : 5,014,280

DATED : May 7, 1991

INVENTOR(S) : TASUYUKI SANADA and TETSUFUMI ODAGAWA

It is certified that error appears in the above-identified patent and that said Letters Patent is hereby corrected as shown below:

Title Page [56] References Cited insert a new section
--U.S. PATENT DOCUMENTS
4,562,569      12/31/85      Yariv et al.--.

Title Page [56] References Cited under FOREIGN PATENT DOCUMENTS "0081590" should be --0031590--;
Insert --63-156385   6/29/88   Japan--
       --63-211785   9/2/88    Japan--.

Title Page [56] References Cited under FOREIGN PATENT DOCUMENTS insert a new section --Other Documents Patent Abstracts of Japan, vol. 11, no. 304 (E-545), 6th May 1987; & JP-A-62 097 386 (NEC Corp.) 06-05-1987 *whole abstract*.

Figure 2:
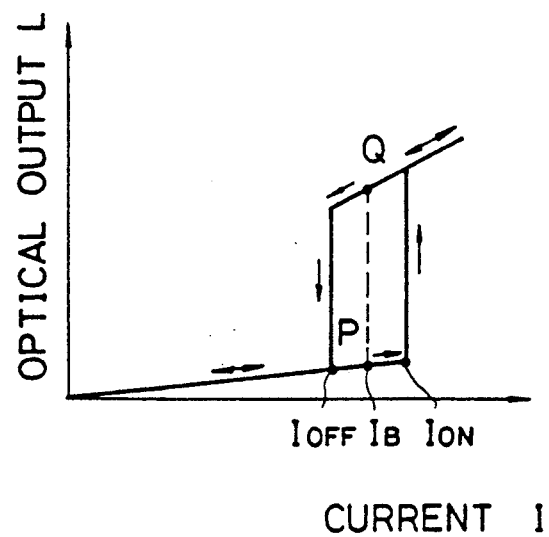
FIG. 2 is a graph showing a characteristic curve with hysteresis pertinent to the laser diode of FIG. 1.
Figure 3:
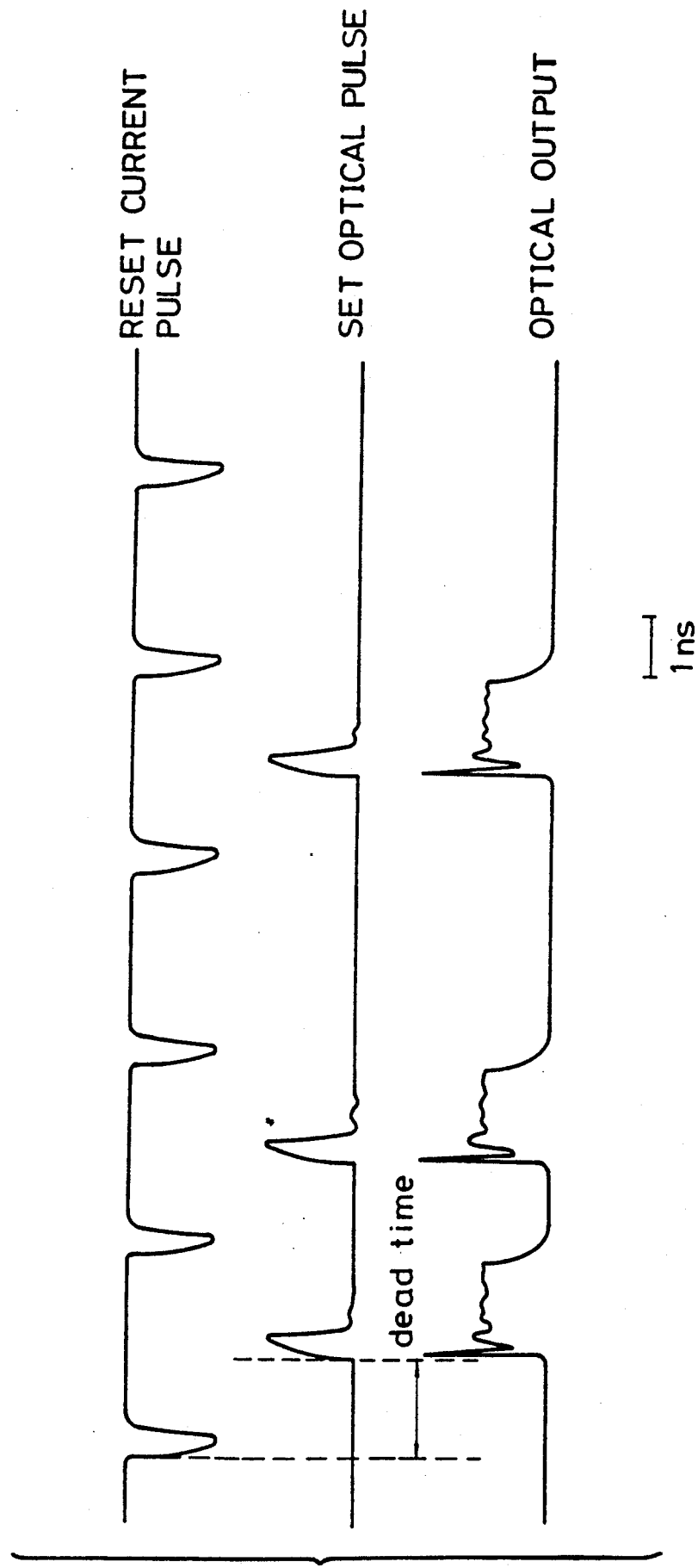
FIG. 3 is a waveform chart showing the dead time pertinent to the laser diode of FIG. 1.

Journal of Lightwave Technology, vol. LT-4, no. 7, July 1986, pages 894-899, IEEE, New York, US; S. Suzuki et al.: "An experiment on high-speed optical time-divisional switching" *Chapters III; figures 2, 3*.

IEE Proceedings Section A a I, vol. 133, no. 4, part J, August 1986, pages 283-292, Stevenage, Hertz, GB; M.C. Perksins et al.: "Analysis of absorptive bistable characteristics of multisegment lasers" *Chapters 1, 5.2; figures 1,19*.--

Column 6, line 36, after "region" insert a period --.--.

UNITED STATES PATENT AND TRADEMARK OFFICE
CERTIFICATE OF CORRECTION

PATENT NO. : 5,014,280

DATED : May 7, 1991

INVENTOR(S) : TASUYUKI SANADA and TETSUFUMI ODAGAWA

It is certified that error appears in the above-identified patent and that said Letters Patent is hereby corrected as shown below:

```
Column 10, line 44, after "off" insert a period --.--;
           line 56, after "diode" insert a period --.--;
           line 60, before "is" insert --T-- and after
                    "nanoseconds" insert a --.--.
Column 14, line 41, delete "pl" and start a new paragraph
                    beginning with "a back-".
```

Signed and Sealed this

Eighth Day of September, 1992

*Attest:*

DOUGLAS B. COMER

*Attesting Officer*   Acting Commissioner of Patents and Trademarks